(12) United States Patent
Siegel

(10) Patent No.: US 6,907,556 B2
(45) Date of Patent: Jun. 14, 2005

(54) SCANABLE R-S GLITCH LATCH FOR DYNAMIC CIRCUITS

(75) Inventor: Joseph R. Siegel, Shrewsbury, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 527 days.

(21) Appl. No.: 10/060,716

(22) Filed: Jan. 30, 2002

(65) Prior Publication Data

US 2003/0145265 A1 Jul. 31, 2003

(51) Int. Cl.$^7$ .......................... G01R 31/28; G11C 19/00
(52) U.S. Cl. ................................. 714/726; 377/73
(58) Field of Search ............................ 714/703, 733, 714/734, 724, 726, 727, 729, 30; 307/42; 377/73, 42

(56) References Cited

U.S. PATENT DOCUMENTS

| | | | | |
|---|---|---|---|---|
| 5,619,511 A | * | 4/1997 | Sugisawa et al. | ........... 714/726 |
| 6,070,259 A | * | 5/2000 | Roisen et al. | ............... 714/726 |
| 6,570,407 B1 | * | 5/2003 | Sugisawa et al. | ............. 326/93 |
| 6,636,996 B2 | * | 10/2003 | Nowka | ....................... 714/727 |

OTHER PUBLICATIONS

Abramovici, M. et al. "Design for testability" in *Digital systems testing and testable design*, 368–381 (1990).

* cited by examiner

*Primary Examiner*—Christine T. Tu
(74) *Attorney, Agent, or Firm*—Lahive & Cockfield, LLP

(57) ABSTRACT

A dynamic sequential device is provided that is adapted for scan control and observation. The dynamic sequential device may be scanned in-circuit as part of a scan chain in a VLSI device or it may be scanned as a discrete device. The dynamic sequential device maintains performance with respect to speed while allowing control and observation of its internal machine states.

20 Claims, 4 Drawing Sheets

SCANABLE R-S GLITCH LATCH FOR DYNAMIC CIRCUITS

TECHNICAL FIELD OF THE INVENTION

The present invention generally relates to semiconductor devices and more particularly, to a dynamic sequential semiconductor device that is scan controllable.

BACKGROUND OF THE INVENTION

With the growing popularity and complexity of very large scale integration (VLSI) designs, traditional test techniques, such as bed of nails tests and card edge tests provide limited visibility into internal VLSI machine states. Moreover, bed of nails tests and card edge tests are limited to a manufacturing environment and provide no assistance in evaluating the functionality of a VLSI device operating in an installed electronic assembly. As a result, insight into internal machine states of a VLSI device is gained through scan testing or automatic test program generation (ATPG).

The use of scan testing or ATPG enables observation of internal machine states of a VLSI device. Although scan test circuitry is designed and built into the VLSI device, there are logical gate assemblies and circuits that do not adapt well to conventional scan testing or ATPG methods. Typically, the addition of conventional scan circuitry causes additional gate delay in the logical gate assembly. One such logical gate assembly that does not adapt well to conventional scan testing methods and circuitry is a dynamic latch, sometimes referred to as a glitch catcher. As such, given that device-operating speed is a significant measure of a component value, conventional scan testing of dynamic sequential devices provides an undue burden to VLSI designs and devices.

SUMMARY OF THE INVENTION

The present invention addresses the above-described limitations of conventional scan testing or ATPG on dynamic sequential devices, such as dynamic RS latches. The present invention overcomes these problems by providing a dynamic sequential device and a method for scan testing the dynamic sequential device that overcomes the inherent performance drawbacks associated with conventional scan testing or ATPG on a dynamic sequential device.

In one embodiment of the present invention, a dynamic sequential device provides a scan circuit that allows the dynamic sequential device to be controlled and observed while preserving the performance of the device with respect to gate delay. The scan circuit includes a control circuit and an output circuit that provide the necessary insight and control over the internal machine state of the dynamic sequential device. The control circuit further includes a pull down circuit to change the state of the dynamic sequential device's dynamic input node before scan control and observation is to occur. The control circuit also includes a scan control circuit driven by various clock signals to control when the dynamic sequential device is in a scan test mode.

The above described approach benefits a VLSI design utilizing one or more dynamic sequential devices, because the internal machine state of each dynamic sequential device can be controlled and observed without impacting the speed or performance of the device. As a result, fault coverage of a VLSI design may be significantly increased with a minimal impact to the cost of the VLSI device itself.

In accordance with another aspect of the present invention, a method is performed to determine functionality of a dynamic sequential circuit capable of storing at least one bit. The dynamic sequential circuit is provided with a scannable test circuit that allows external control of the dynamic circuit to observe its internal state. The scannable test circuit receives one or more clock signals and one or more control signals to control and observe the internal state of the dynamic sequential device. The functionality of the dynamic sequential device is determined from the data asserted by the scannable test circuit when triggered to do so by the one or more clock signals and the one or more control signals.

The above-described approach benefits a microprocessor architecture that utilizes dynamic sequential devices to store data. As a result, fault coverage in the microprocessor can increase without impacting the speed and efficiency of storing data in a dynamic sequential device of the microprocessor.

According to another aspect of the present invention, a method is practiced for in-circuit testing of a dynamic sequential device having a scannable test circuit. The scannable test circuit controls the internal state of the dynamic sequential device to determine its operability. Moreover, when the scannable test circuit is determining the internal state of the dynamic sequential device, the dynamic circuitry driving the dynamic sequential device is prevented from asserting. In this manner, valid data and test data are prevented from co-mingling to ensure data integrity.

BRIEF DESCRIPTION OF THE DRAWINGS

An illustrative embodiment of the present invention will be described below relative to the following drawings, in which like reference characters refer to the same parts throughout the different views. The drawings illustrate the principles of the invention and are not drawn to scale.

DETAILED DESCRIPTION

Figure 1:
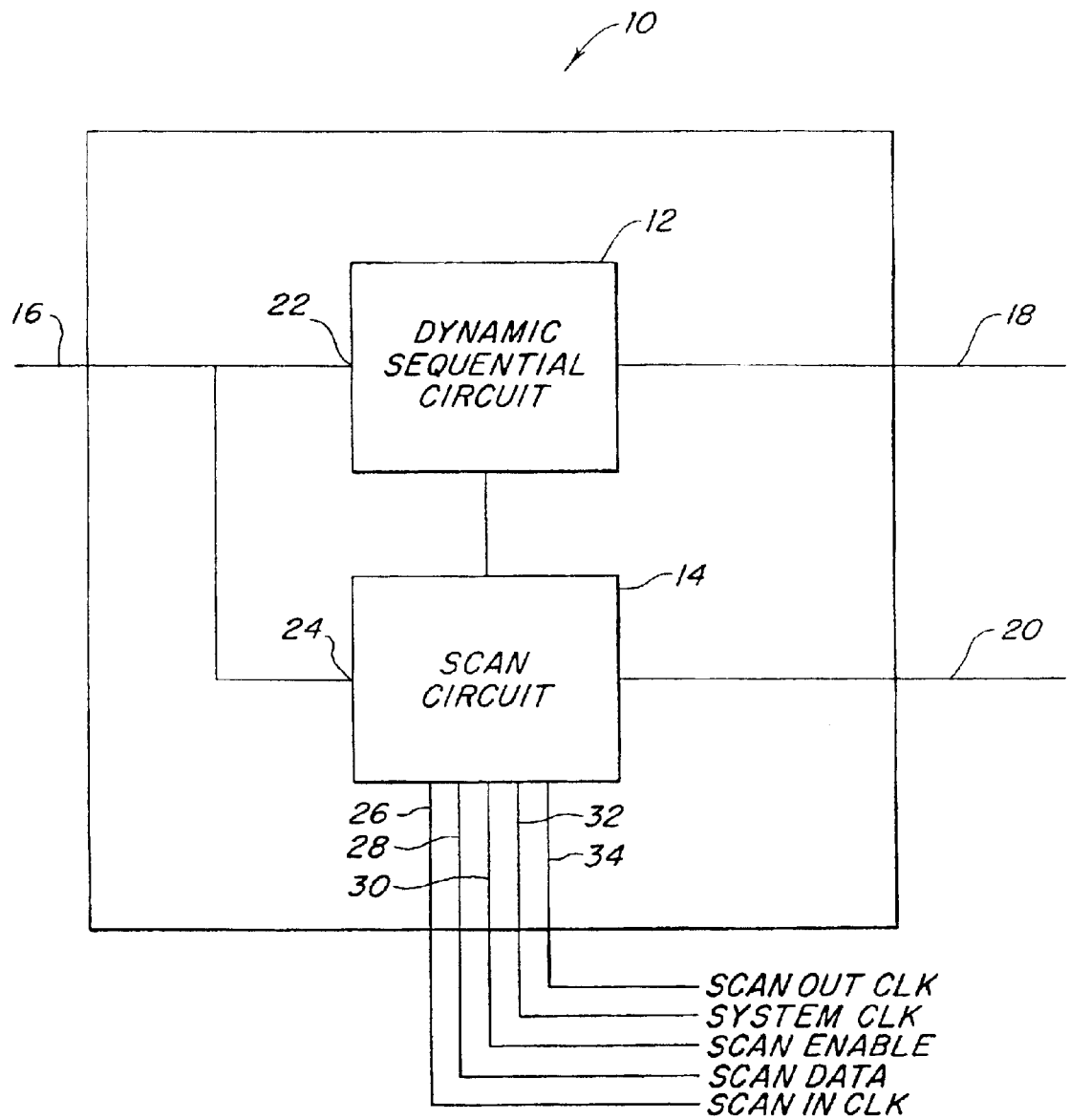
FIG. 1 is a schematic block diagram of a dynamic sequential device suitable for practicing the illustrative embodiment of the present invention.

The illustrative embodiment of the present invention provides a dynamic sequential device, such as a dynamic latch that allows scan testing or ATPG while maintaining device performance in terms of the speed at which the device evaluates incoming data. In the illustrative embodiment, a dynamic sequential device adapted for storing a single bit is coupled to a scan test circuit to allow the dynamic sequential device to be scanned and controlled to determine its internal state.

The scan test circuit is adapted to include a control circuit and an output circuit, wherein the control circuit is coupled to the reset line of the digital memory element of the dynamic sequential circuit, and the output circuit is coupled to the complemented output of the same dynamic digital memory element. Specifically, the control circuit is gated by at least two clock signals and at least one control signal to control when the dynamic memory device is reset. The output circuit of the scan test circuit is driven by the complemented output of the dynamic memory device and asserts a logic output level indicative of the dynamic sequential device's functionality. Notably, the present invention maintains the conventional gate delay associated with the data path of conventional dynamic sequential device's to one gate delay, while significantly improving the controllability and observability of the internal machine states of the illustrated dynamic sequential device. Moreover, the illustrated dynamic sequential device can be coupled to other dynamic circuits, such as, domino circuits without impacting the precharge stages or the evaluate stages of the coupled domino circuits. As configured, the dynamic sequential device is able to be set and reset within the same clock phase, that is, set and reset while the clock is either in its A phase or in its B phase. This ability to be set and reset in the same clock phase allows the dynamic sequential device to capture and store an input signal that transitions from a logic "1" level to a logic "0" level.

The dynamic sequential device of the present invention provides a range of significant benefits to designers of VLSI devices and particularly to designers and architects of microprocessors. The present invention allows the designer or architect to add scan control and observation to dynamic sequential device's without adding additional gate delay to the device's data line. The dynamic sequential device can increase fault coverage of a VLSI design, such as a microprocessor, and significantly lower costs associated with test generation and functional tests at the die level, component level, board level, and system level. The dynamic sequential device of the present invention can be to fabricate with a minimum stack height for the scan control circuit, which allows a quicker response on the reset line of the dynamic sequential device's memory element. Those skilled in the art will recognize that the dynamic sequential device of the present invention is a three state device, with one state being a precharge state, one state being an evaluate state, and one state being a scan state.

For purposes of the discussion below it is helpful to clarify the meaning of the phrase "gate delay". A "gate delay" refers to the amount of time required for a waveform to travel from the input of a gate to the output of a gate as measured from the 50% point of the leading edge of the input waveform and the 50% point of the falling edge of the output waveform.

In the illustrative embodiment of the present invention, the semiconductor device is attractive for use in VLSI designs, such as microprocessors employing a reduced instruction set computing (RISC) architecture. This semiconductor device allows scan testing or ATPG to occur without adding gate delay to the data path. The ability to scan control and observe an internal state of the illustrative semiconductor device also allows a microprocessor to increase its self diagnostic capabilities by increasing fault coverage. The diagnostic capability provided by the illustrative embodiment facilitates functional tests of the VLSI design that, in turn, result in lower functional test development costs for VLSI designs, as well as lowering the time required to apply and perform functional testing.

FIG. 1 is a block diagram of an exemplary semiconductor device 10 that is suitable for practicing the illustrative embodiment of the present invention. The semiconductor device 10 includes the dynamic sequential circuit 12 and the scan circuit 14. The dynamic input node 16 is adapted to receive logical data and is coupled to the dynamic sequential circuit 12 and the scan circuit 14. Output node 18 is coupled to the dynamic sequential circuit 12 and is adapted for asserting the logical output of the dynamic sequential circuit 12. Output node 20 is coupled to the scan circuit 14 and is adapted to assert the logical scan data asserted by the scan circuit 14. The scan circuit 14 is coupled to one or more clock lines and control lines, such as, the scan in clock input node 26, the scan data input node 28, the scan enable input node 30, the system clock input node 32, and the scan out clock input node 34.

In operation the dynamic input node 16 is precharged during either the A phase or B phase of the system clock to ensure that the dynamic sequential circuit input node 22 and the scan circuit input 24 are at a known state when the dynamic sequential circuit 12 evaluates. Those skilled in the art will recognize that the dynamic sequential circuit 12 may be formed using an A phase dynamic latch or a B phase dynamic latch. Moreover, those skilled in the art will recognize that the dynamic input node 16 may be precharged by a PMOS device (not shown) internal to the exemplary semiconductor device 10 or the dynamic input node 16 may be precharged by a PMOS device externally coupled to the dynamic input node 16.

During normal operation, that is, when the exemplary semiconductor device 10 is not in its scan test state, the exemplary semiconductor device 10 performs the function of an A phase dynamic latch. For example, during the B phase of the system clock that is, when the system clock is at a logic "0" level, the exemplary semiconductor device 10 is closed and the dynamic input node 16 is precharged to a logic "1" level. The exemplary semiconductor device 10 evaluates the data on the dynamic input node 16 during the A phase of the system clock, that is, when the system clock is at a logic "1" level. If during the A phase of the system clock, the dynamic input node 16 transitions from a logic "1" level to a logic "0" level, the output node 18 rises to a logic "1" level; otherwise the output node 18 remains at a logic "0" level. The exemplary semiconductor device 10 will be recognized by one skilled in the art to be an "A phase dynamic latch" because the latch evaluates during the A phase of the clock, that is, when the clock is at a high logic level, and is latched or closed in the B phase of the clock, that is, when the clock is at a low logic level.

The exemplary semiconductor device 10 enters its scan test state when the appropriate timing sequence is asserted at the input nodes of the scan circuit 14. One such timing sequence that triggers the exemplary semiconductor device 10 to enter its scan state is when the scan in clock input node 26 is at logic "1" level, the scan data input node 28 is at a logic "1" level, the scan enable input node 30 is at logic "0" level, the system clock input node 32 is at a logic "1" level, and the scan out clock input node 34 is at logic "0" level. Those skilled in the art will recognize that the timing relationship described above with regard to the input nodes 26, 28, 30, 32 and 34 is illustrative and that other timing relationships are possible without departing from the scope of the present invention. Moreover, those skilled in the art will recognize that the dynamic input node 16 is precharged to a logic "1" level before the exemplary semiconductor device 10 enters its scan state.

One appropriate timing sequence to assert the scan test results of the exemplary semiconductor device 10 occurs after the dynamic input node 16 is pulled to a logic "0" level and the scan in data input node 28 is in a "don't care" state, the scan enable input node 30 is at a logic "0" level, the system clock input node 32 is at a logic "0" level, and the scan out clock input node 34 is at a logic "1" level. With this timing relationship being asserted at the scan in clock input node 26, the scan data input node 28, the scan enable input node 30, the system clock input node 32, and the scan out input node 34, the scan circuit 14 asserts its scan data on scan circuit output node 20.

Those skilled in the art will appreciate that the depiction of the exemplary semiconductor circuit 10 in FIG. 1 is intended to be merely illustrative and not limiting of the present invention. The illustrative embodiment of the present invention presumes that the exemplary semiconductor device 10 contains a single dynamic sequential device 12; however, the exemplary semiconductor device 10 may include multiple dynamic sequential devices or may have multiple dynamic input nodes that feed or drive a single dynamic sequential device. As will be described in more detail below, the dynamic sequential circuit 12 is presumed to have characteristics from one or more dynamic logic families.

Figure 2:
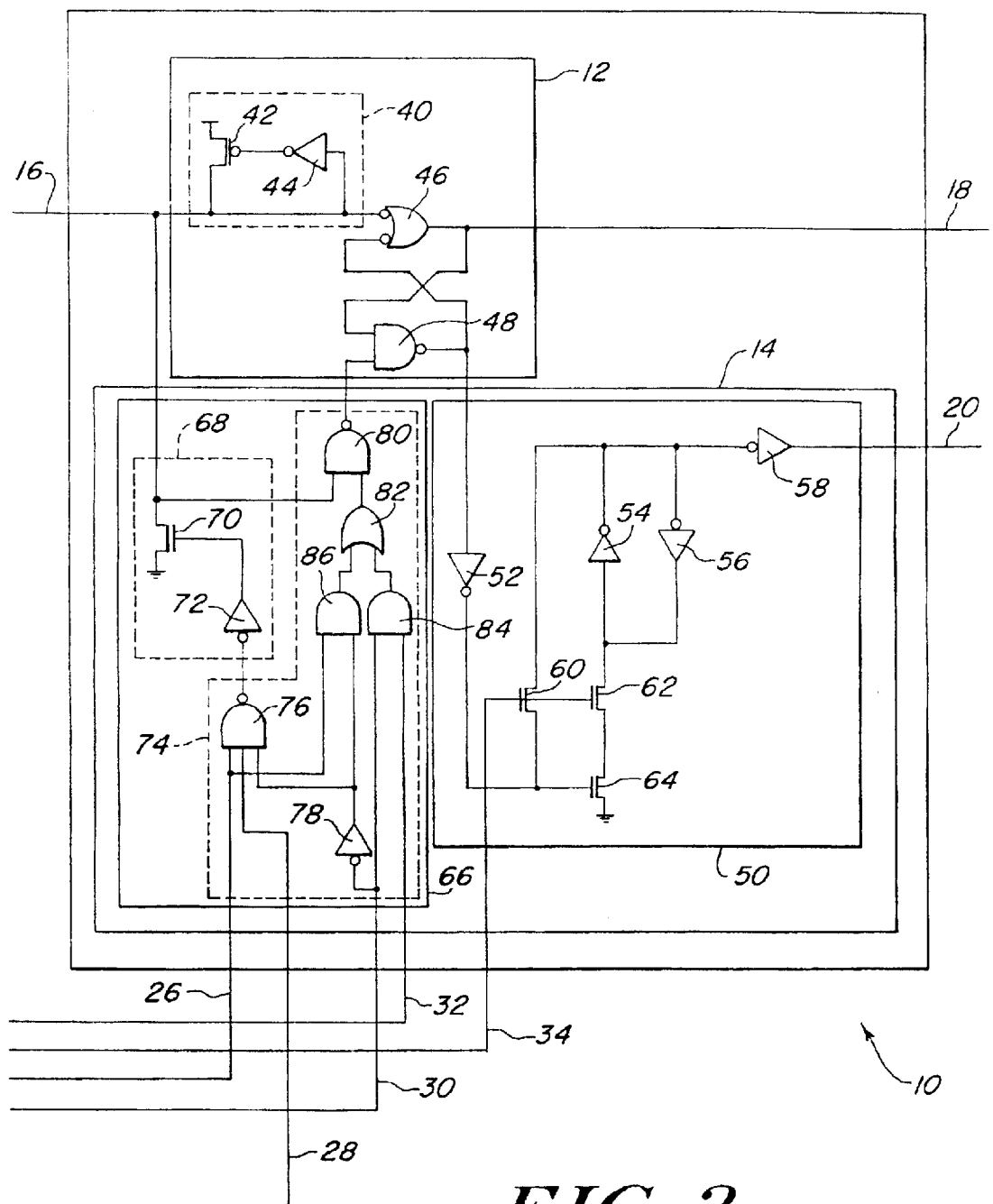
FIG. 2 depicts an electrical circuit that is suitable for implementing the scan test technique for the dynamic sequential device of the illustrative embodiment.
Figure 4:
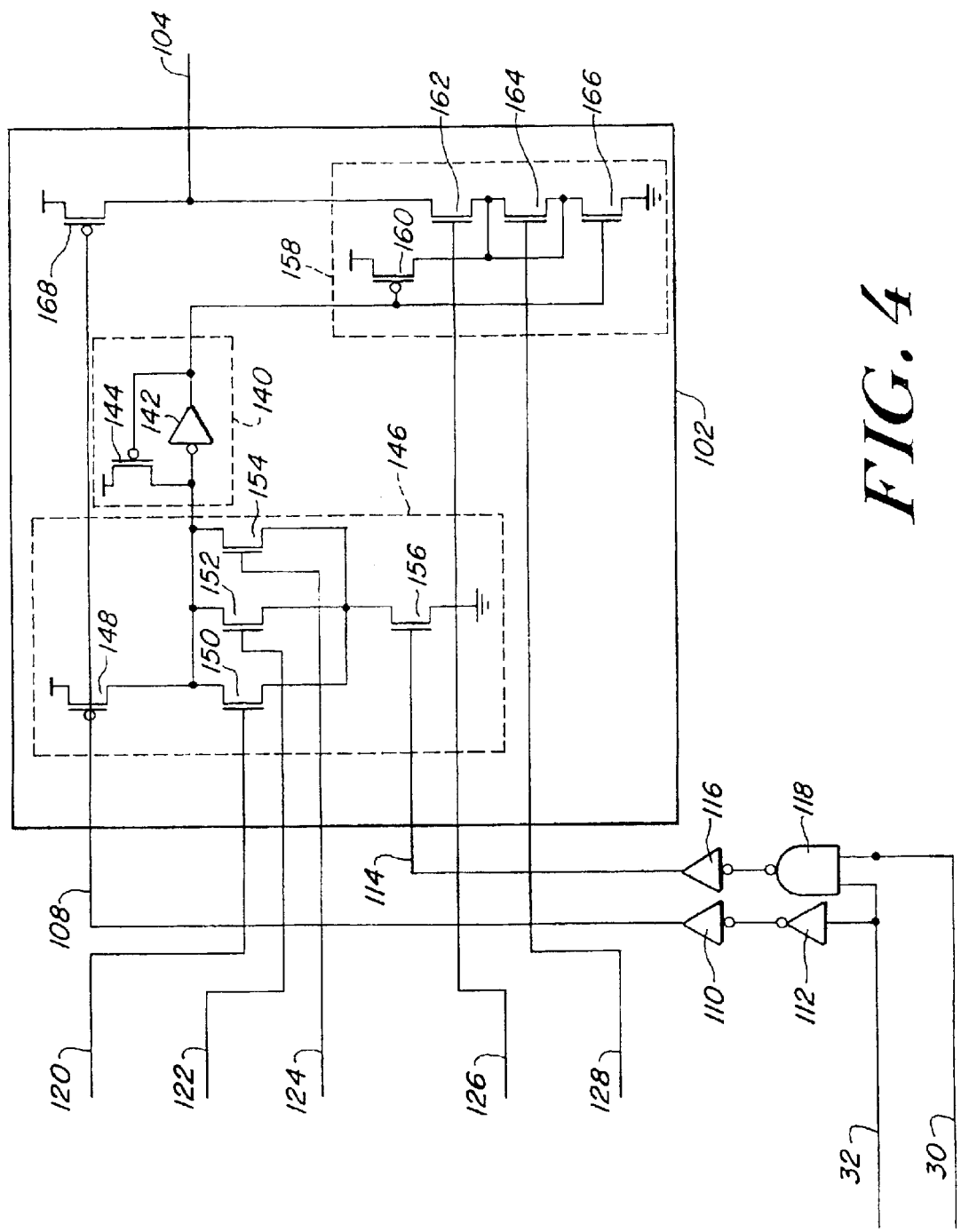
FIG. 4 depicts an electrical circuit suitable for use with the dynamic sequential device to support in-circuit testing of the dynamic sequential device of the illustrative embodiment of the present invention.

The transistors depicted in FIGS. 2 and 4 are from the metal oxide semiconductor field effect transistor (MOSFET) family of transistors, which includes P channel MOSFETs, also referred to as PMOS transistors, and N channel MOSFETs also referred to as NMOS transistors and complimentary symmetry MOSFETs also referred to as CMOS transistors. Nevertheless, those skilled in the art will appreciate that the present invention may be practiced with the scan circuit 14 having characteristics of a dynamic logic family or a static logic family.

FIG. 2 illustrates the exemplary semiconductor device 10 in more detail. As illustrated, the dynamic sequential circuit 12 includes a keeper circuit 40, and the NAND gate 46 crossed coupled with the NAND gate 48. The cross coupled NAND gates 46 and 48 form a memory element that is able to store a low going pulse asserted by a logic circuit coupled to the dynamic input node 16. One skilled in the art will recognize that the cross-coupled NAND gate 46 and NAND gate 48 form a set-reset latch. The set line of the latch formed by while the reset line of the latch formed by the cross coupled NAND gate 46 and NAND gate 48 is coupled to the output of the NAND gate 80 of the scan circuit 14. The output of the NAND gate 46, or the Q output, is coupled to the output node 18. The output of NAND gate 48, or the $\overline{Q}$ output, is coupled to the scan circuit 14 to drive the scan output circuit 50. The scan output circuit 50 will be described below in more detail in conjuction with the scan circuit 14. The keeper circuit 40 coupled to the dynamic input node 16 overcomes problems associated with transistor leakage current and "keeps" the dynamic input node 16 at a logic "1" level once it is precharged.

The keeper circuit 40 includes the PMOS transistor 42 and the inverter 44. The PMOS transistor 42 has its source coupled to a voltage source supplying a high level voltage, its drain coupled to the dynamic input node 16, and its gate coupled to the output of the inverter 44. The inverter 44 has its input coupled to the dynamic input node 16. In this manner, the keeper circuit 40 holds or keeps the dynamic input node 16 at a known logic "1" level to overcome any voltage droop caused by leakage current. Nevertheless, one skilled in the art will recognize that the keeper circuit 40 is an optional circuit.

The NAND gate 46 has its first input coupled to the dynamic input node 16 and its second input cross-coupled to the output of the NAND gate 48. The NAND gate 48 has its first input cross-coupled to the output of the NAND gate 46, its second input coupled to the output of the NAND gate 80 of the scan circuit 14, and its output cross-coupled to the second input of NAND gate 46 and to the input of inverter 52 of the scan circuit 14.

The scan circuit 14 is adapted to include the scan control circuit 66 and the scan output circuit 50. The scan control circuit 66 includes a pull down circuit 68 and a control circuit 74. The pull down circuit 68 is configured to include an inverter 72 coupled to the NMOS transistor 70. The input of the inverter 72 is coupled to the output of the NAND gate 76 of the control circuit 74. The NMOS transistor 70 has its gate coupled to the output of the inverter 72, its drain coupled to ground, and its source coupled to the dynamic input node 16 and the first input of the NAND gate 80.

The configuration of the NMOS transistor 70 coupled to the inverter 72 operate as a pull down circuit to pull down the dynamic input node 16 to a known state when the exemplary semiconductor device 10 enters its scan state. When the pull down circuit 68 is enabled by the control circuit 74, the pull down circuit 68 pulls the dynamic input node 16 from a logic "1" level to a logic "0" level.

The control circuit 74 is configured to include the NAND gate 76 having its output coupled to the input of the inverter 72. The NAND gate 76 is a three input logic gate having its first input coupled to the scan in clock input node 26 and the first input of the two input AND gate 86. The second input of the NAND gate 76 is coupled to the scan data input node 28 while the third input of the NAND gate 76 is coupled to the output of the inverter 78.

The inverter 78 has its input coupled to the scan enable input node 30 and has its output coupled to the second input of the AND gate 86. The AND gate 84 has its first input coupled to the scan enable input node 30 and its second input coupled to the system clock input node 32. The AND gate 84 has its output coupled to the second input of NOR gate 82. The first input of the NOR gate 82 is coupled to the output of the AND gate 86 while its output is coupled to the second input of the NAND gate 80.

As configured, the scan control circuit 66 is able to control when the dynamic sequential circuit 12 evaluates the scan test data and when the dynamic sequential circuit 12 evaluates non-test data. On the whole, the scan circuit 14 allows the dynamic sequential circuit 12 to be scanned and controlled while maintaining the dynamic sequential circuit's performance with respect to gate delay in the data path. Moreover, the scan circuit 14 adds functionality to the dynamic sequential circuit 12 with minimal impact to the number of latch components and correspondingly with minimal impact to the area constraints of the exemplary semiconductor device 10.

The scan output circuit 50 of the scan circuit 14 is driven by the output of the NAND gate 48. The scan output circuit 50 as illustrated includes the inverter 52 having its input coupled to the output of the NAND gate 48, and its output coupled to the gate of the NMOS transistor 64 and the source of the NMOS transistor 60. The NMOS transistor 60 has its gate coupled to the scan out clock input node 34 and its drain coupled to the input of the inverter 58. The inverter 58 has its output coupled to the scan circuit output node 20. The scan out clock input node 34 is also coupled to the gate of the NMOS transistor 62. The NMOS transistor 62 has its source coupled to the drain of the NMOS transistor 64, and its drain coupled to input of the inverter 54 and the output of the inverter 56. The source of the NMOS transistor 64 is coupled to ground while the output of the inverter 54 and the input of the inverter 56 are coupled to the input of the inverter 58.

In operation, the scan circuit 14 allows the dynamic sequential circuit 12 to be scanned and controlled. The scan circuit 14 controls when the dynamic sequential circuit 12 is in a scan state based on the timing relationship of the signals asserted at the scan in clock input node 26, the scan data input node 28, the scan enable input node 30, the system clock input node 32, and the scan out clock input node 34. For illustration purposes, we consider the dynamic sequential circuit 12 to be an A phase dynamic latch. Nevertheless, one skilled in the art will recognize that the dynamic sequential circuit 12 can also be a B phase dynamic latch. Moreover, those skilled in the art will recognize that the dynamic sequential circuit 12 can be a dynamic jam latch, a dynamic glitch latch, or a dynamic pulse catcher.

By way of example, the dynamic sequential circuit 12 operates in the following manner to evaluate non-test data asserted on the dynamic input node 16. Initially, the dynamic input node 16 is precharged to a logic "1" level when the system clock is in the B phase. When the system clock transitions to the A phase, the dynamic sequential circuit 12 evaluates the data present at the dynamic input node 16. If at the start of the evaluate phase the output node 18 is at a logic "1" level the dynamic sequential device 12 drives the output node 18 to a logic "0" level. However, if the dynamic input node 16 should transition from its precharged logic "1" level to a logic "0" level the dynamic sequential circuit 12 will assert a logic "1" level at output node 18. If the logic level at the dynamic input node 16 remains at a logic "1" level during the entire evaluate phase of the dynamic sequential circuit 12 the output node 18 remains at a logic "0" level.

The scan circuit 14 operates in the following manner when the employing semiconductor circuit 10 is in its precharge state. A logic "0" is asserted at the scan in clock input node 26, the scan data input node 28, the scan enable input node 30, the system clock input node 32, and the scan out clock node 34. As a result of this timing relationship on the scan in clock input node 26, the scan data input node 28, the scan enable input node 30, the system clock input node 32, and the scan out clock input node 34, the NAND gate 76 asserts a logic "1" level that is inverted by the inverter 72 to prevent the NMOS transistor 70 from turning on. This allows the first input of the NAND gate 80 to be precharged to a logic "1" level. In similar fashion, the logic combination of the NAND gate 84, the AND gate 86 and the NOR gate 82 combine to assert a logic "0" level at the second input of the NAND gate 80. Consequently, the NAND gate 80 asserts a logic "1" level on the reset line of the latch formed by the NAND gate 48 and the NAND gate 46. The reset line is held at a logic "1" level during the precharge phase of the exemplary semiconductor circuit 10 to prevent the output node 18 from changing state. With the scan out clock input node 34 at a logic "0" level, the NMOS transistor 60 and the NMOS transistor 62 do not turn on and allow the latch formed by the inverter 54 and the inverter 56 to maintain the state of the output node 20.

When the exemplary semiconductor circuit 10 is in its evaluate state, the scan in clock input node 26, the scan data input node 28, and the scan out clock input node 34 are at a logic "0" level, and the scan enable input node 30 and the system clock input node 32 are at a logic "1" level. With this timing relationship on the scan in clock input node 26, the scan data input node 28, the scan out clock input node 30, the system clock input node 32, and the scan out clock input node 34, the dynamic sequential circuit 12 of the exemplary semiconductor circuit 10 is in its evaluate phase. While the dynamic sequential circuit 12 is in its evaluate phase, should the state of the dynamic input node 16 transition from a logic "1" level to a logic "0" level, the memory element of the exemplary semiconductor circuit 10 is able to store the state transition on the dynamic input node 16, which, in turn, causes the output node 18 to transition from a logic "0" level to a logic "1" level. With this timing relationship being asserted at the scan in clock input node 26, the scan data input node 28, the scan enable input node 30, the system clock input node 32, and the scan out input node 34, the dynamic sequential circuit 12 is able to evaluate the logical data asserted on the dynamic input node 16, and assert a response in one gate delay.

When the exemplary semiconductor circuit 10 is in its evaluate state, the NAND gate 76 asserts a logic "1" level, which, in turn, is inverted by the inverter 72, which prevents the NMOS transistor 70 from turning on. By preventing the NMOS transistor 70 from turning on, any state transition that occurs on the dynamic input node 16 is attributable to an event outside of the exemplary semiconductor circuit 10.

In the evaluate state of the exemplary semiconductor circuit 10, the NOR gate 82 asserts a logic "1" level to the second input of NAND gate 80. Since the first input of the NAND gate 80 is precharged to a logic "1" level the NAND gate 80 asserts a logic "0" level to the reset line of the latch formed by the NAND gate 48 and the NAND gate 46. Should the state of the dynamic input node 16 transition from a logic "1" level to a logic "0" level, the output of the NOR gate 82 stays at a logic "1" level, and the NAND gate 80 asserts a logic "1" level to the reset line of the latch formed by the cross coupled NAND gate 48 and the NAND gate 46. As a result of the dynamic input node 16 state transition from the logic "1" level to the logic "0" level, the NAND gate 46 asserts a logic "1" level at the output node 18. Since the scan out clock input node 34 is held a logic "0" level during the evaluate phase of the dynamic sequential circuit 12 the NMOS transistor 60 and the NMOS transistor 62 do not turn on. Hence, the output node 20 does not change state.

For the exemplary semiconductor circuit 10 to enter its scan state and allow the scan circuit 14 to scan and control the dynamic sequential circuit 12, the timing relationship of the scan in clock input node 26, the scan data input node 28, the scan enable input node 30, the system clock input node 32 and the scan out clock input node 34 can be the following. The scan in clock input node 26 is at a logic "1" level, the scan data input node 28 is at a logic "1" level, the scan enable input node 30 is at a logic "0" level, the system clock input node 32 is at a logic "1" level, and the scan out clock input 34 is at a logic "0" level. For scan testing to properly initialize, the dynamic input node 16 must be precharged to a logic "1" level prior to the start of scan test. Moreover, if scan test of the exemplary semiconductor circuit 10 occurs in-circuit, any logic device immediately coupled to the dynamic input node 16 must be halted or prevented from asserting to allow scan chain testing to occur and to prevent corruption of non-test date.

The assertion of a logic "1" level at the scan in clock input 26 and the scan data input node 28 along with the assertion of a logic "0" level at the scan enable input 30 allows the NAND gate 76 to assert a logic "0" level, which allows the inverter 72 to assert a logic "1" level. The logic "1" level asserted by the inverter 72 turns on the NMOS transistor 70, which pulls the dynamic input node 16 and the first input of the NAND gate 80 to a logic "0" level. With the scan in clock input node 26 and the scan data input node 28 at a logic "1" level and the scan enable input node 30 at a logic "0" level, the NOR gate 82 asserts a logic "1" level. As such, the NAND gate 80 asserts a logic "1" level on the reset line of the latch formed by the cross-coupled NAND gate 48 and NAND gate 46. Since the NMOS transistor 70 is enabled, the dynamic input node 16 falls from a logic "1" level to a logic "0" level causing the NAND gate 48 to assert a logic "0" level to drive the scan output circuit 50.

The scan output circuit 50 asserts a logic level that represents the health or functionality of the dynamic sequential circuit 12 when the scan in clock input node 26 is at a logic "0" level, the scan data input node 28 is at a logic "0" level, the scan enable input node 30 is at a logic "0" level, the system clock input node 32 is at a logic "0" level, and the scan out clock input node 34 is at a logic "1" level. With this timing relationship at the scan in clock input node 26, the scan data input node 28, the scan enable input node 30, the system clock input node 32, and the scan out clock input node 34, the logic "0" level asserted by the NAND gate 48 is inverted by the inverter 52 to turn on the NMOS transistor 64 and to provide the source of the NMOS transistor 60 with a logic "1" level. As a result, the NMOS transistor 60 and the NMOS transistor 62 are enabled and the serial stack up of the NMOS transistor 62 and the NMOS transistor 64 together act as a reset to reset the output node 20. The resetting of the output node 20 ensures valid scan data is being asserted at the output node 20.

With the NMOS transistor 60 enabled, the NMOS transistor 60 drives the input of the inverter 58 with a logic "1" level, which results in a logic "0" level being asserted on the output node 20. As illustrated, a logic "0" level asserted on the output node 20 indicates a properly functioning sequential dynamic circuit 12. If the logic value asserted at the output node 20 is a logic "1" value, this indicates a functional issue with the dynamic sequential circuit 12. One skilled in the art will recognize that the logic level asserted at the output node 20 to indicate functionality of the dynamic sequential circuit 12 can be chosen to meet the needs of the application in which the exemplary semiconductor circuit 10 is utilized.

Those skilled in the art will recognize that the timing relationships described above to allow the scan in clock signal asserted at the scan in clock input node 26 and the scan out clock signal asserted at the scan out clock input node 34 are separated by at least three phases of the system clock asserted at the system clock input node 32, to prevent a race condition in the exemplary semiconductor circuit 10.

Figure 3:
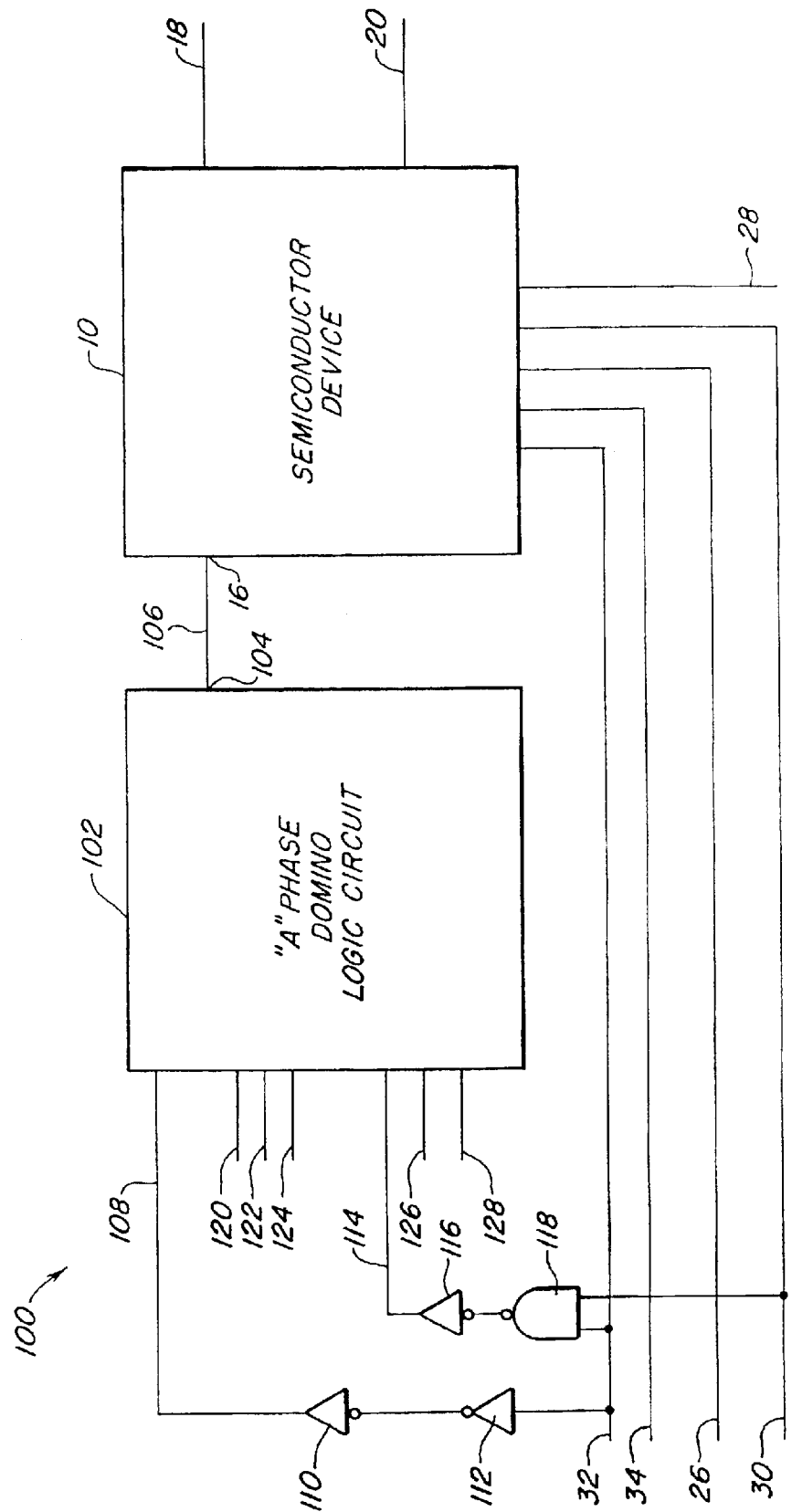
FIG. 3 is a schematic block diagram of a dynamic circuit coupled to a dynamic sequential device suitable for implementing in-circuit testing of a dynamic sequential device according to the illustrative embodiment of the present invention.

FIG. 3 illustrates the exemplary circuit 100 where the exemplary semiconductor device 10 is driven by the A phase domino logic circuit 102. FIG. 3 illustrates an in-circuit implementation of the exemplary semiconductor device 10.

The A phase domino logic circuit 102 is coupled to the exemplary semiconductor device 10 via the transmission path 106. Those skilled in the art will recognize that the transmission path 106 can include any conductive path suitable for transmitting data, such as a bus, or a dedicated point to point trace on a printed wiring board. The transmission path 106 transmits the data asserted by the A phase domino logic circuit 102 at its output node 104 to the dynamic input node 16 of the exemplary semiconductor device 10. The A phase domino logic circuit 102 of the illustrative embodiment is configured to have five data input nodes, namely, data input nodes 120, 122, 124, 126 and 128. The details of the A phase dynamic logic circuit 102 will be discussed in more detail below.

In order to prevent a data conflict between the A phase domino logic circuit 102 and the exemplary semiconductor device 10 when the exemplary semiconductor device 10 is in its scan state the domino logic circuit 102 and the exemplary semiconductor device 10 must evaluate on the same phase of the clock. For example, the A phase domino logic circuit 102 and the exemplary semiconductor device 10 both evaluate during the A phase of the clock and precharge during the B phase of the clock. To accomplish scan testing of the exemplary semiconductor device 10 in-circuit with the A phase domino logic circuit 102, the output node 104 of the A phase domino logic circuit 102 is held at a logic "1" level. In the illustrative embodiment of the present invention, the output node 104 is held at a logic "1" level by gating the system clock input node 32 with the scan enable input node 30 to prevent the first stage of the domino logic circuit 102 from evaluating. The inverter 112 and the inverter 110 couple the system clock input node 32 to the precharge transistors within the A phase domino logic circuit 102 along transmission path 108. The inverter 110 and the inverter 112 act as buffers to preserve the phase relationship of the gated clock signal asserted by the inverter 116 on transmission path 114 to the evaluate transistors within the A phase domino logic circuit 102.

The exemplary circuit 100 avoids co-mingling and corruption of non-test data with scan test data when the exemplary semiconductor device 10 is in its scan state. As such, data integrity and reliability are maintained. Moreover, the exemplary circuit 100 allows the system clock on input node 32 to continuously run so that any B phase semiconductor devices coupled to the exemplary circuit 100 can continue to precharge and evaluate when the exemplary semiconductor device 10 is in its scan test.

FIG. 4 depicts the A phase domino logic circuit 102 in more detail. The A phase domino logic circuit 102 is configured with a first logic stage 146 and a second logic stage 158. Coupling the first logic stage 146 and the second logic stage 148 is keeper circuit 140. Those skilled in the art will recognize that the keeper circuit 140 acts to reduce leakage problems commonly associated with the NMOS transistors forming the first logic stage 146 and the second logic state 158.

In more detail, the first logic stage 146 includes the PMOS transistor 148 that operates as the precharge device that precharges the first logic stage 146 to a known logic "1" level. The source of the PMOS transistor 148 is connected a voltage source providing a high level voltage signal, its gate coupled to the output of the inverter 110, and its drain coupled to the drains of the NMOS transistor 150, the NMOS transistor 152, the NMOS transistor 154, and the drain of the PMOS transistor 144. In addition, the drain of the NMOS transistor 148 is also coupled to the input of the inverter 142. The NMOS transistor 150 has its gate coupled to the data input node 120, and its drain coupled to the drain of the NMOS transistor 152, the drain of the NMOS transistor 154, and its source coupled to the drain of the NMOS transistor 156. The NMOS transistor 152 has its gate coupled to the data input node 122 and its source coupled to the drain of the NMOS transistor 156. In like manner, the NMOS transistor 154 has its gate coupled to the data input node 124 and its source coupled to the drain of the NMOS transistor 156. The NMOS transistor 156 has its gate coupled to the output of the inverter 116 and its source coupled to ground.

As configured, the first logic stage 146 performs a logical NOR operation on the data asserted at the data input node 120, the data input node 122, and the data input node 124. As such, if the data asserted on the data input node 120 is at a logic "1" level, or if the data asserted on the data input node 122 is at a logic "1" level, or if the data asserted on the data input node 124 is at a logic "1" level when the first logic stage 146 evaluates, the first logic stage 146 asserts a logic "0" level to drive the inverter 142. For the first logic stage 146 to assert a logic "1" level, the data asserted on the data input node 120, and the data input node 122, and the data input node 124 must all be at a logic "0" level. The first logic stage 146 evaluates during the A phase of the clock asserted on the system clock input node 32. To ensure that the first logic stage 146 evaluates only when the exemplary semiconductor device 10 is also in its evaluate state, the clock asserted at the system clock input node 32 is gated with the scan enable signal asserted at the scan enable input node 30. Since the system clock input node 32 and the scan enable input node 30 are gated by the NAND gate 118, the first logic stage 146 will evaluate only when the logic level of the signal asserted at the system clock input node 32 and the scan enable input node 30 are at logic "1" levels.

The second logic stage 158 of the A phase dynamic circuit 102 performs a logical NAND operation on the data asserted by the first logic stage 146, the data asserted on the data input node 126 and the data asserted on the data input node 128. The PMOS transistor 168 operates as the precharge transistor for the second logic stage 158. Accordingly, the PMOS transistor 168 precharges the second logic stage 158 when the clock signal on the system clock input node 32 is in its B phase or at its logic "0" level. The PMOS transistor 168 also operates to precharge the dynamic input node 16 of the exemplary semiconductor device 10 illustrated in FIG. 3. Nevertheless, those skilled in the art will recognize that the exemplary semiconductor device 10 can also include a PMOS transistor to precharge the dynamic input node 16.

The second logic stage 158 is configured in the following manner. PMOS transistor 160 has its source coupled to a voltage source supplying a high voltage signal. The PMOS transistor 160 also has its gate coupled to the output of the inverter 142, the drain of the PMOS transistor 144, the gate of the NMOS transistor 166, and the drains of the PMOS transistor 148 and the NMOS transistor 150. The PMOS transistor 160 has its drain coupled to the source of the NMOS transistor 162, the drain of NMOS transistor 164, the source of NMOS transistor 164, and the drain of the NMOS transistor 166. The NMOS transistor 162 has its drain coupled to the drain of its PMOS transistor 168 and the output node 104. The gate of the NMOS transistor 162 is coupled to the data input node 126. The NMOS transistor 164 has its gate tied to the data input node 128, its drain tied to the source of the NMOS transistor 162, and its source tied to the drain of the NMOS transistor 166. The NMOS transistor 166 has its source coupled to ground.

In operation, the second logic stage 158 asserts a logic "1" level at the output node 104 if the inverter 142 asserts a logic "0" level, or if the logic level of the data asserted on the data input node 126 is at a logic "0" level, or if the logic level of the data asserted on the data input node 128 is at a logic "0" level. The second logic stage 158 asserts a logic "0" on the output node 104 if the logic level asserted by the inverter 142 is at logic "1" level and the logic level of the data signal asserted on the data input node 126 is at a logic "1" level and the logic level of the data asserted on the data input node 128 is at a logic "1" level. Moreover, the keeper circuit 140 is configured to include the PMOS transistor 144 having its source coupled to a voltage source supplying a high level voltage signal and its drain coupled to the input of the inverter 142. The gate of the PMOS transistor 144 is coupled to the output of the inverter 142. The keeper circuit 140 operates to keep the output node of the first logic stage 146 at a logic "1" level to overcome leakage problems associated with NMOS transistors.

The configuration of the A phase domino logic circuit 102 provides the additional benefit of asserting a logic "1" level on the output node 104 when the exemplary semiconductor device 10 is in its scan state. In this manner, the dynamic input node 16 is precharged to a logic "1" level when the exemplary semiconductor device 10 changes from the scan state to the evaluate state.

Those skilled in the art will appreciate that the combinational logic configuration illustrated in FIG. 4 is merely illustrative and not limiting of the present invention. Further, the gated clock illustrated in FIG. 4 to prevent the first logic stage 146 for evaluating when the exemplary semiconductor device 10 is in its scan state, can also be used to directly control when the second logic stage 158 evaluates.

While the present invention has been described with reference to an illustrative embodiment thereof, those skilled in the art will appreciate that various changes in form and detail may be made without departing from the intended scope of the present invention nestified on the appended claims.

What is claimed is:

1. A dynamic sequential device comprising:
   a scan circuit that allows said dynamic sequential device to be controlled and observed during a scan.

2. The dynamic sequential device of claim 1, wherein said scan circuit comprises,
   an input circuit that operates to control the internal state of the dynamic sequential device; and
   an output circuit that asserts a data value that represents the internal state of the dynamic sequential device, wherein said input circuit and said output circuit allow said dynamic sequential device to be scanned and controlled.

3. The dynamic sequential device of claim 2, wherein said input circuit comprises,
   a pull down circuit to maintain state of a dynamic input node of said dynamic sequential device in a scan state; and
   a scan control circuit driven by one or more clock signals to control when said dynamic sequential device is in said scan state.

4. The dynamic sequential device of claim 2, wherein said output circuit of said scan circuit is driven by said dynamic sequential device.

5. The dynamic sequential device of claim 1, wherein said dynamic sequential device comprises one of a dynamic glitch latch and a dynamic pulse catcher.

6. A method of testing a dynamic sequential circuit capable of storing at least one bit, said method comprising the steps of:
   providing said dynamic sequential circuit with a scan circuit to control and determine a state of said dynamic sequential circuit; and
   controlling said scan circuit to determine said state of said dynamic sequential circuit using one or more clock signals and one or more control signals.

7. The method of claim 6, further comprising the step of determining from a data value asserted by said scan circuit if said dynamic sequential circuit is capable of storing at least one bit.

8. The method of claim 7, further comprising the step of maintaining state of a dynamic input node of said dynamic sequential circuit when said scan circuit determines said state of said dynamic sequential circuit.

9. The method of claim 8, further comprising the step of precharging said dynamic input node to a known state after said scan circuit asserts said data value.

10. The method of claim 6, wherein the one or more clock signals includes a scan in clock signal and a scan out clock signal, wherein said scan in clock signal initiates said controlling of said dynamic sequential circuit and said scan out clock signal triggers said scan circuit to assert said state of said dynamic sequential circuit.

11. The method of claim 6, wherein said dynamic sequential circuit comprises one of a dynamic glitch latch and a dynamic pulse catcher.

12. A method for in-circuit testing of a dynamic sequential device having a scannable test circuit, said method comprising the steps of:

controlling said scannable test circuit to determine a state of said dynamic sequential device; and determining if said dynamic sequential device is able to operate as a dynamic sequential device based on said determined state of said dynamic sequential device.

13. The method of claim 12, further comprising the steps of:

preventing a dynamic circuit in-circuit with said dynamic sequential circuit from evaluating when said scannable test circuit determines said state of said dynamic sequential device.

14. The method of claim 13, further comprising the step of maintaining state of a dynamic input node of said dynamic sequential device when said scannable test circuit determines said state of said dynamic sequential device.

15. The method of claim 14, further comprising the step of precharging said dynamic input node to a known state before said scannable test circuit determines said state of said dynamic sequential device.

16. The method of claim 12, wherein said dynamic sequential device comprises one of a dynamic glitch latch and a dynamic pulse catcher.

17. A dynamic latch comprising:

a test circuit adapted to allow in-circuit scan testing of said dynamic latch.

18. The dynamic latch of claim 17, wherein said test circuit comprises:

an input circuit wherein said input circuit controls when said dynamic latch changes state; and an output circuit to assert said state change.

19. The dynamic latch of claim 18, wherein said input circuit comprises, a pull down circuit; and a control circuit, wherein said pull down circuit and said control circuit control when said dynamic latch changes state during said in-circuit scan testing.

20. The dynamic latch of claim 18, wherein said output circuit asserts a logic level representative of an internal state of said dynamic latch, wherein said output circuit is driven by said dynamic latch to assert said logic level.

* * * * *